(12) United States Patent
Ushikoshi et al.

(10) Patent No.: US 6,617,514 B1
(45) Date of Patent: Sep. 9, 2003

(54) CERAMICS JOINT STRUCTURE AND METHOD OF PRODUCING THE SAME

(75) Inventors: Ryusuke Ushikoshi, Tajimi (JP); Hideyoshi Tsuruta, Tokai (JP); Tomoyuki Fujii, Nagoya (JP)

(73) Assignee: NGK Insulators, Ltd. (JP)

( * ) Notice: Subject to any disclaimer, the term of this patent is extended or adjusted under 35 U.S.C. 154(b) by 0 days.

(21) Appl. No.: 09/095,157

(22) Filed: Jun. 10, 1998

(30) Foreign Application Priority Data

Jun. 20, 1997 (JP) .............................................. 9-164582

(51) Int. Cl.⁷ ................................................. H01R 4/00
(52) U.S. Cl. .................................................... 174/84 R
(58) Field of Search ...................... 174/84 R, 152 GM, 174/262, 265; 361/779, 803

(56) References Cited

FOREIGN PATENT DOCUMENTS

| EP | 0 434 313 A2 | 6/1991 |
| EP | 0726239 | * 8/1996 |
| EP | 0 726 239 A2 | 8/1996 |
| EP | 0 753 494 A1 | 1/1997 |
| EP | 0 855 764 A2 | 7/1998 |
| EP | 0 856 881 A2 | 8/1998 |
| JP | 8-277171 | 10/1996 |
| JP | 8-277173 | 10/1996 |
| JP | 9-12769 | 1/1997 |
| WO | WO 93/23246 | 11/1993 |

OTHER PUBLICATIONS

Hawley, "the Condensed Chemical Dictionary" p. 506, 1981.*
Hawley, "Condensed Chemical Dictionary", 1981.*
Patent Abstracts of Japan, vol. 015, No. 080, Feb. 25, 1991 & JP 02 302381 A (Shinko Electric Ind. Co., Ltd), Dec. 14, 1990 Abstract.

* cited by examiner

Primary Examiner—Chau N. Nguyen
(74) Attorney, Agent, or Firm—Parkhurst & Wendel, L.L.P.

(57) ABSTRACT

The disclosed ceramics joint structure, in which a ceramics member having an oxidation resistance property and a metal member are joined via a joint layer, has a structure such that a part of the embedded member is exposed to a joint surface of the ceramics member, which is contacted with the joint layer to form a metal exposing portion, and the ceramics member and the metal exposing portion are joined via the joint layer to the metal member respectively. Moreover, the joint layer is mainly made of one or more metal selected from the group consisting of gold, platinum and palladium.

6 Claims, 11 Drawing Sheets

FIG_3
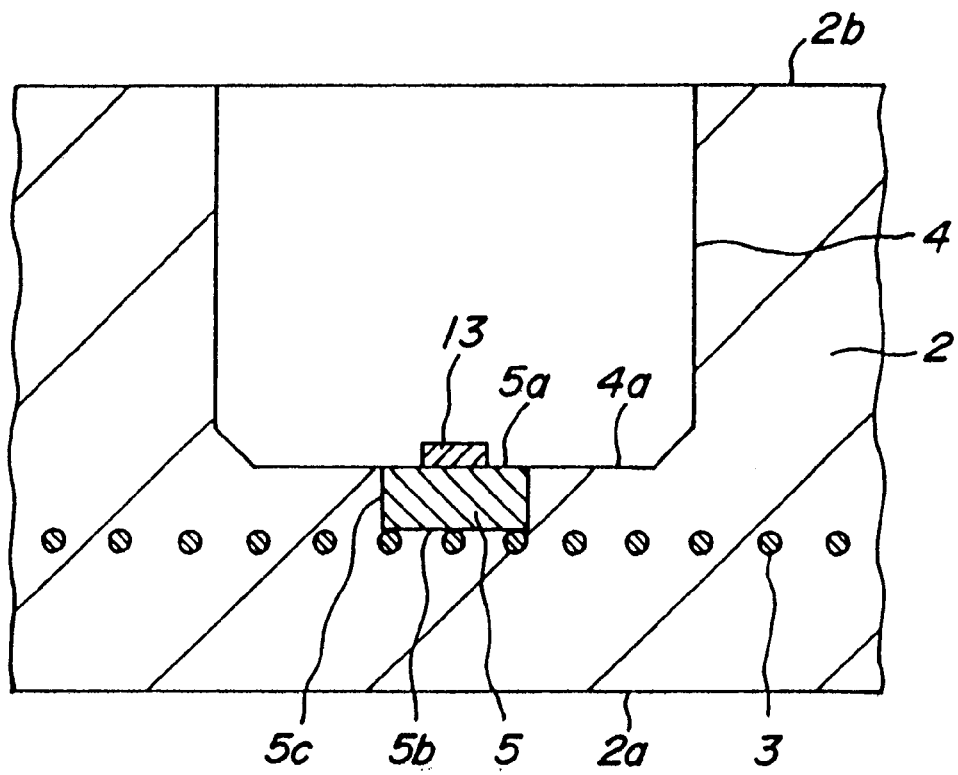
FIG_4
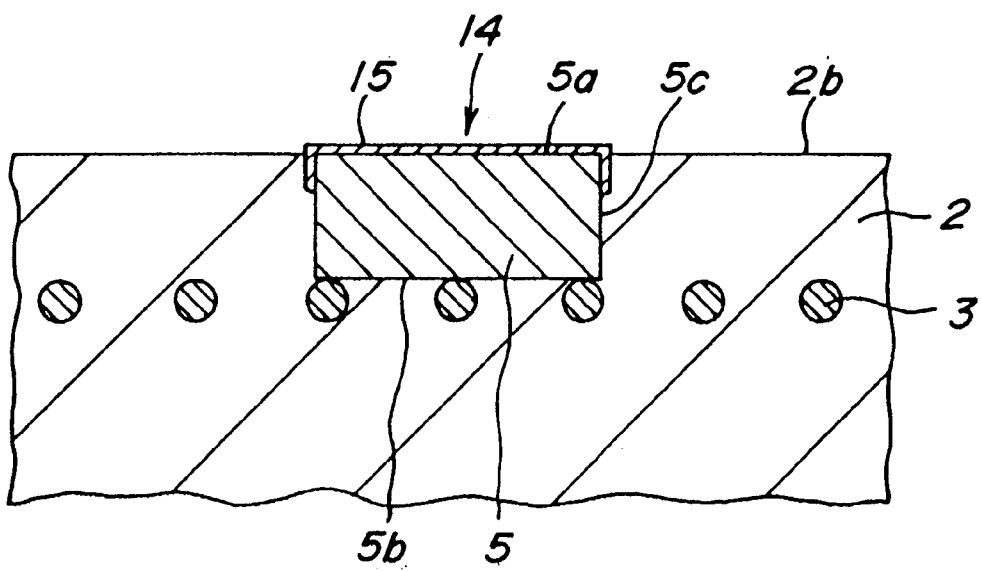

FIG_5
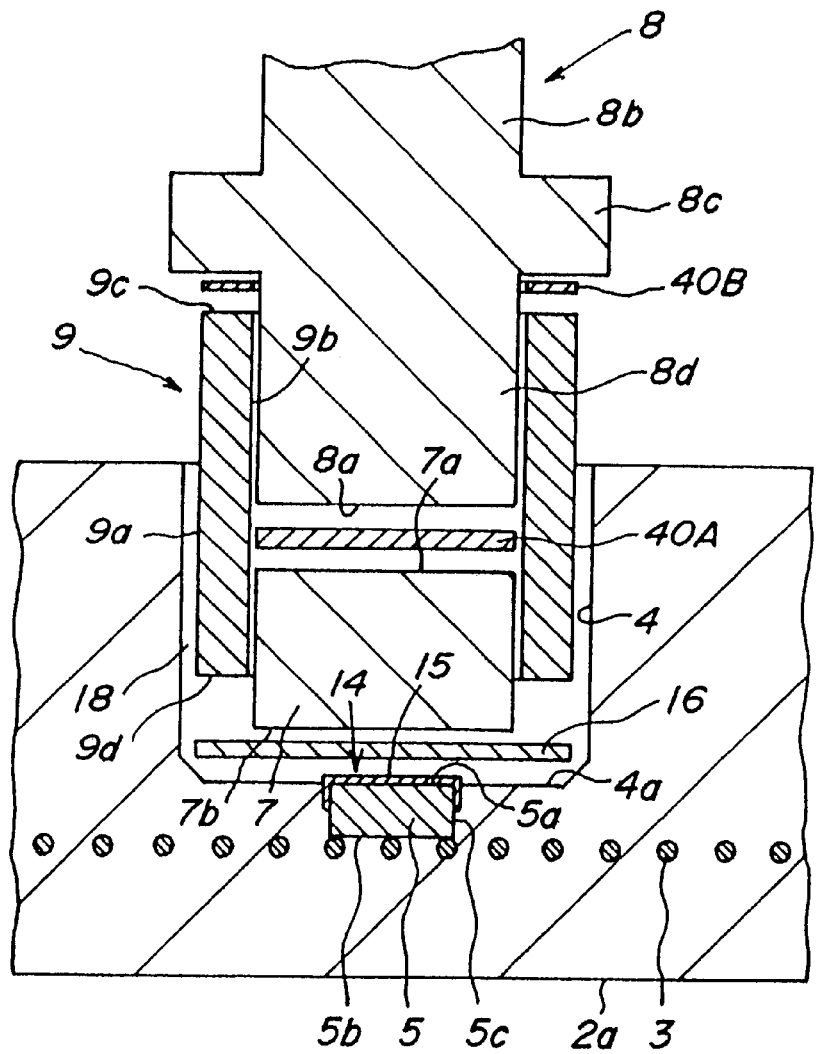
FIG_6a
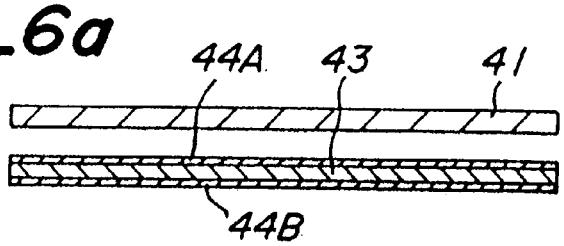
FIG_6b
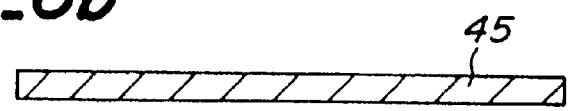

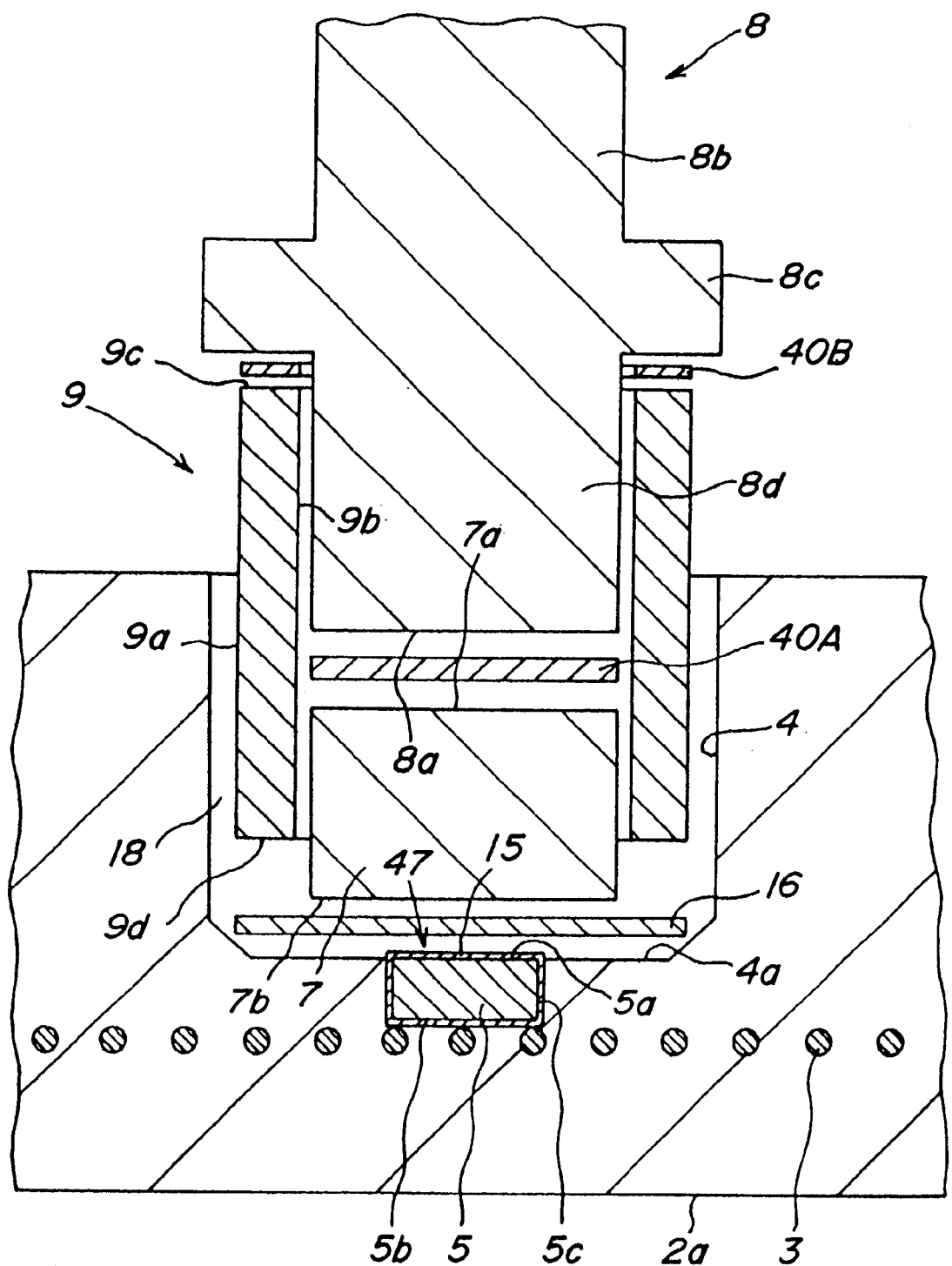
FIG_7

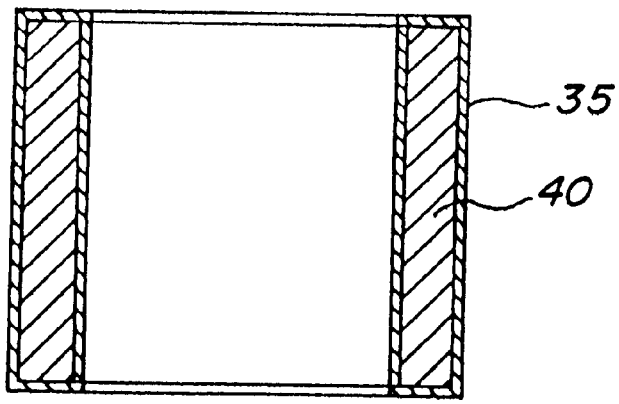
FIG_12a
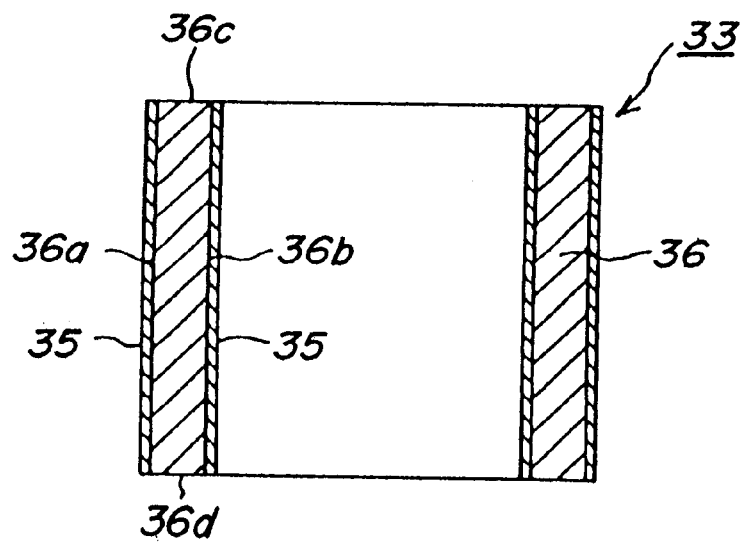
FIG_12b
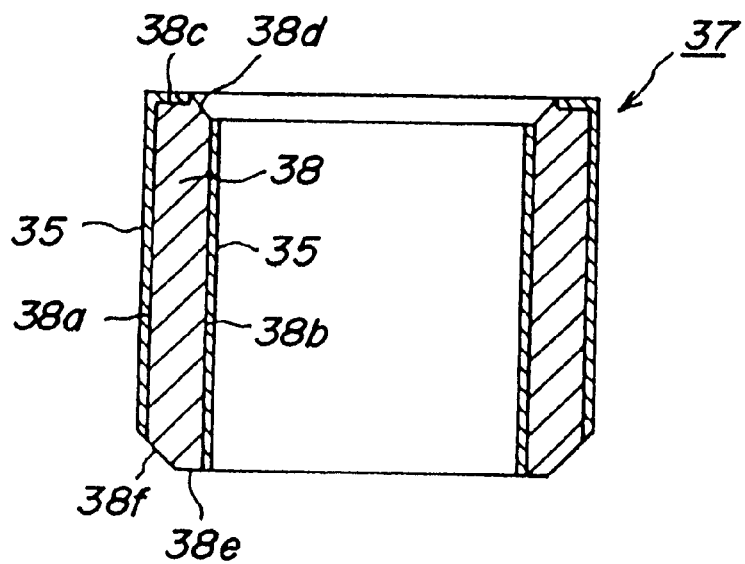
FIG_12c

CERAMICS JOINT STRUCTURE AND METHOD OF PRODUCING THE SAME

BACKGROUND OF THE INVENTION

1. Field of the Invention

The present invention relates to a ceramics joint structure and a method of producing the same.

2. Description of Related Art

Nowadays, electrostatic chucks are being used to adsorb and hold semiconductor wafers in transferring, light-exposing, film-forming such as CVD and sputtering, fine processing, washing, etching, dicing, etc. for semiconductor wafers. Dense ceramics are used as substrates for such electrostatic chucks. Particularly, in the semiconductor producing apparatus, a halogen based corrosive gas such as $ClF_3$, $CF_4$, $NF_3$ is often used as an etching gas or a cleaning gas. In order to rapidly heat and cool the semiconductor wafer while being held by such a substrate, the substrate of the electrostatic chuck desirably has a high heat conductivity. Further, it is desired that the substrate has such thermal shock resistance as not to be destroyed by rapid temperature changes. Dense aluminum nitride and alumina have high corrosion resistance against the halogen based corrosion gas mentioned above.

In the field of the semiconductor producing apparatuses, susceptors in which built-in high frequency electrodes for generating plasma have been practically used. In the field of such high frequency electric power generating apparatuses, a metal electrode is embedded in a substrate of aluminum nitride or dense alumina. Further, in the field of the semiconductor producing apparatuses, there are used ceramics heaters in which a metal resistor is embedded in a substrate of aluminum nitride or alumina for controlling the temperature of a wafer in each process.

In these apparatuses, it is necessary that the metal electrode is embedded in the ceramic substrate made of aluminum nitride or the like, and that the metal electrode is electrically coupled to an external electric power supply connector. However, a coupling portion for this purpose is exposed to a heat cycle between extreme high temperatures and low temperatures in an oxidative atmosphere and further in a corrosive gas atmosphere. Such a joint portion is desired to maintain high joining strength and excellent electric coupling performance for a long time period even under such a bad condition.

The present inventors have continuously studied the coupling structures as mentioned above. For example, Japanese patent application No. 8-24,835 disclosed that a tip of an electric power supply connector is coupled to a metal electrode in a susceptor with an Al alloy brazing material, a Cu alloy brazing material or a Ni alloy brazing material each having a corrosive resistance. Further, Japanese Patent Laid-Open Publication No. 8-277,173 (JP-A-8-277,173) proposed that a mesh or net metal electrode is embedded in an AlN ceramics, while a part of the mesh or net metal electrode is exposed, and the exposed mesh or net portion and the AlN ceramics are brazed to a tip face of the electric power supply connector. In the techniques mentioned above, there are proposed brazing methods having a high corrosive resistance against the halogen based corrosive gas and its plasma. Moreover, the present inventors further proposed, in Japanese patent application No. 9-12,769, (U.S. Ser. No. 09/013,045), a specific connector-metal electrode joint structure which can maintain high joining strength and excellent conductive performance even if high temperatures or heat cycle is applied thereto under an oxidative atmosphere.

These techniques mentioned above were very effective. However, during the inventors' further investigation, the following drawbacks were found in an extreme case. That is to say, a molybdenum resistance heater and a molybdenum terminal were embedded in a ceramics heater, and the terminal was brazed to an external electric power supply connector by using an active silver brazing material. In this case, when the ceramics heater was operated for a long time period at, for example, 700° C., the molybdenum terminal was corroded. In an extreme case, a joint structure was broken, or a compound having a low melting point was leached on a surface of the heater to cause a bad insulation performance. Further, a silver component was moved to a surface of the heater by its migration under direct or alternating current to cause also a bad insulation performance.

SUMMARY OF THE INVENTION

It is an object of the invention to provide a ceramics joint structure and a method of producing the same, in which a corrosion of an embedded member and a bad insulation performance due to a leaching of a compound having low melting point on a surface of a ceramics member or due to a migration of a metal component are prevented even if it is exposed in an oxidative atmosphere such as air during a long term operation at a high temperature region.

According to the invention, a ceramics joint structure in which a ceramics member having an oxidation resistance property and a metal member are joined via a joint layer, comprises a structure such that: (1) an embedded member made of a metal including at least molybdenum is embedded in said ceramics member; (2) a part of said embedded member is exposed to a joint surface of said ceramics member, which is contacted with said joint layer to form a metal exposing portion; (3) said ceramics member and said metal exposing portion are joined via said joint layer to said metal member respectively; and (4) said joint layer is mainly made of one or more metal selected from the group consisting of gold, platinum and palladium.

Moreover, according to the invention, a method of producing the ceramics joint structure mentioned above, comprises the steps of: forming said metal exposing portion by exposing a part of said embedded member to said joint surface of said ceramics member; arranging a material for said joint layer between said joint surface and said metal member; and heating them under an oxidation resistance atmosphere to join said ceramics member and said metal exposing portion to said metal member respectively.

The inventors investigated a cause of the corrosion and the bad insulation performance of the molybdenum terminal. During this investigation, it was found that a minor amount of oxidative atmosphere such as air leaked from a brazed portion reaches to the molybdenum terminal and oxidizes molybdenum to generate molybdenum trioxide, and that the thus generated molybdenum trioxide reacts with silver to generate a compound oxide $AgMoO_4$ having a low melting point. This compound having a low melting point further corroded molybdenum to cause a resistance increase or to, in an extreme case, cause a breakage of a joint portion. In addition, this compound having a low melting point was leached on a surface of a ceramics member to cause a bad insulation performance.

According to the present invention, the inventors contrived the structure in which a part of the embedded member is exposed to a joint surface of the ceramics member, which is contacted with the joint layer to form a metal exposing portion; the ceramics member and the metal exposing portion are joined via the joint layer to the metal member respectively; and the joint layer is mainly made of one or more metals selected from the group consisting of gold, platinum and palladium. In this case, the ceramics member and the embedded member were firmly joined to the external metal member, and thus it was possible to prevent a decrease of joining strength and a decrease of insulation resistance. Moreover, it was found that the migration is not caused under direct or alternating current by making the joint layer from one or more metals selected from the group consisting of gold, platinum and palladium.

BRIEF DESCRIPTION OF THE DRAWINGS

FIG. 3 is a cross sectional view depicting a state in which a hole 4 is formed in a substrate 2 and a terminal main body 5 is exposed to the hole 4;

FIG. 4 is an enlarged cross sectional view showing a neighbor of a terminal 14;

FIG. 5 is a cross sectional view illustrating a state before producing the joint structure shown in FIG. 1; FIG. 6a is a cross sectional view depicting a state before stacking a brazing material 41 and an active metal foil 43, and FIG. 6b is a cross sectional view showing a brazing material 45;

FIG. 7 is a cross sectional view illustrating a state before producing the joint structure using a terminal 47;

FIGS. 12a, 12b and 12c are cross sectional views respectively showing a producing process of the atmosphere-shielding members 33 and 37.

DESCRIPTION OF THE PREFERRED EMBODIMENT

Figure 1:
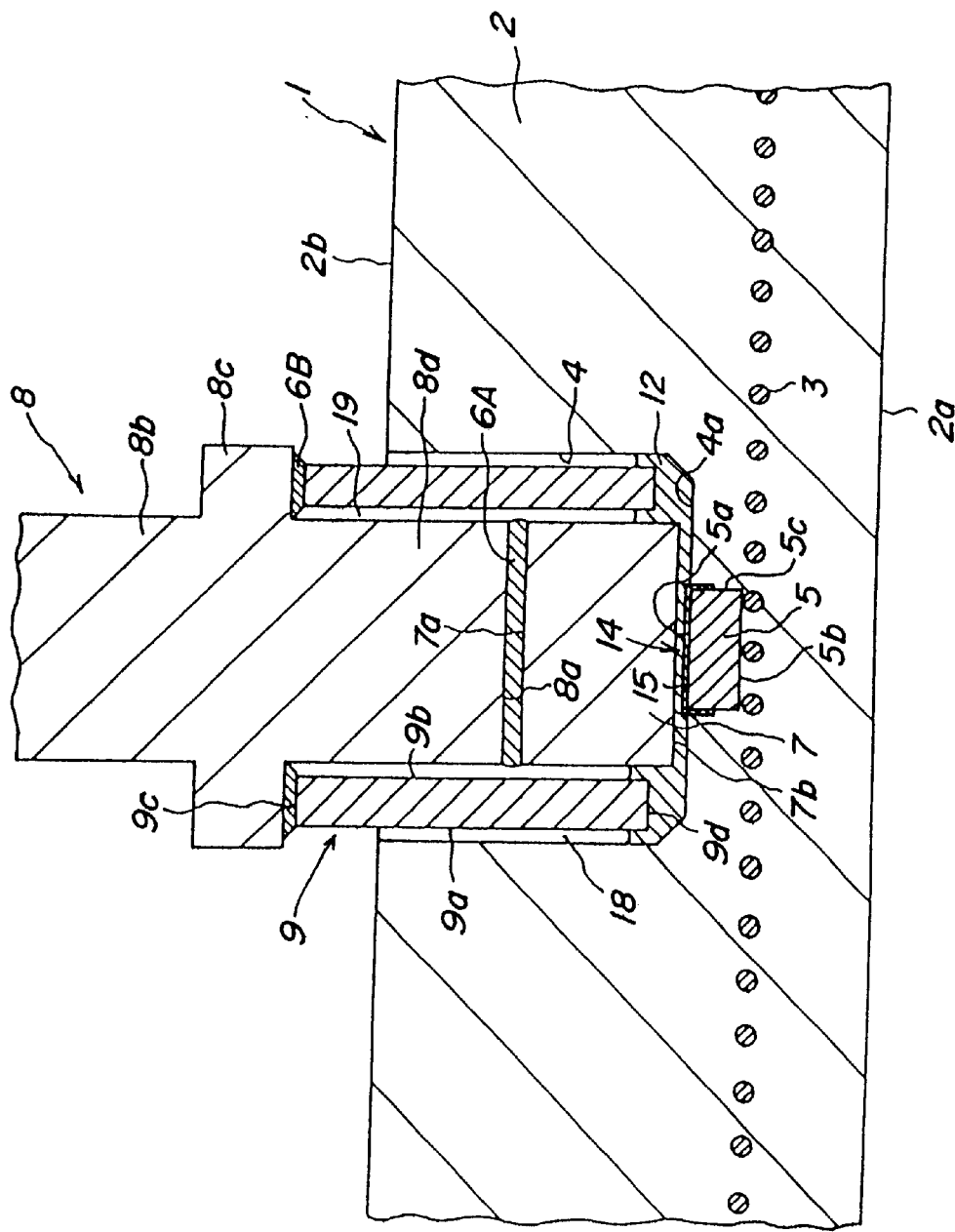
FIG. 1 is a cross sectional view showing one embodiment of a joint structure according to the invention.

As a ceramics member according to the invention, there are, for example, a heater in which a resistance heater is embedded in a ceramics substrate, an electrostatic chuck in which an electrode for the electrostatic chuck is embedded in a ceramics substrate, a heater with an electrostatic chuck in which a resistance heater and an electrode for the electrostatic chuck are embedded in a ceramics substrate, an electrode apparatus for a high frequency generation in which an electrode for a plasma generation is embedded in a ceramics substrate, and an electrode apparatus for a high frequency generation in which an electrode for a plasma generation and a resistance heater are embedded in a ceramics heater. In theses ceramics members mentioned above, it is necessary to arrange an electric power supply member for supplying an electric power to the electrode in the ceramics member.

In the case of using a metal electrode as an embedded member, it is preferred to use the metal electrode in a form of a planar metal bulky member. Here, a term "planar metal bulky member" means not only a planar integral metal shaped body but also a wire or a planar body arranged in a spiral or zigzag form.

Normally, since the metal electrode is sintered together with ceramics powders such as alumina powders or aluminum nitride powders, it is preferred to form the metal electrode by a metal having a high melting point. As such a metal having high melting point, tantalum, tungsten, molybdenum, platinum, rhenium, hafnium and their alloys may be recited. From the standpoint of preventing semiconductor contamination, it is further preferred to use tantalum, tungsten, molybdenum and their alloys.

As the planar bulky member, the following may be recited.

(1) A planar bulky member made of a thin plate.
(2) A planar bulky electrode member in which a plurality of small openings are formed. This includes a bulky member made of a planar material having numerous small holes, and a netlike bulky member. As the planar member having numerous small holes, a punched metal may be recited.

The embedded member is formed by a metal including at least molybdenum. Such a metal is for example pure molybdenum or an alloy of molybdenum with the other metal. As such a metal constructing an alloy with molybdenum, it is preferred to use tungsten, copper, nickel and aluminum.

In the present invention, a main ingredient of a joint layer is one or more metal selected from the group consisting of gold, platinum and palladium. Such a metal is included in the joint layer at more than 50 wt % with respect to all the metal in the joint layer. It is preferred to be more than 70 wt % and more preferably more than 80 wt %. Among them, it is most preferred to use gold from the view point of an oxidation resistance.

In the joint layer, it is preferred to include one or more active metal selected from the group consisting of titanium, zirconium, hafnium, vanadium, niobium and magnesium. In this case, it is possible to improve an adhesion property and a joining strength of the joint layer with respect to the ceramics member.

In the joint layer, it is possible to include one or more third component selected from the group consisting of Si, Al, Cu and In.

Here, when a compounding amount of active metal is less than 0.3 wt %, a wettability of the joint layer so drops that effective joining may not be realized in some cases. On the other hand, when a compounding amount of active metal is more than 20 wt %, a reaction layer at a joint boundary is so large that cracks may be formed in some cases. Therefore, it is preferred to set a compounding amount of active metal in a range of 0.3–20 wt %. Moreover, when a total compounding amount of third component is more than 50 wt %, an intermetallic compound increases and in an extreme case a crack is generated at the joint boundary. Therefore, it is preferred to set a total compounding amount of third component in a range of not more than 50 wt %.

Further, it is preferred to include 5–50 wt % of nickel in the joint layer. In this case, when the metal member is formed by nickel or nickel alloy, it is possible to reduce an excessive melting to the joint layer. There-fore, it is possible to improve the sealing property of an embedded terminal after joining. Moreover, when one or more metals selected from the group consisting of gold, platinum and palladium is coated on a surface of the terminal prior to a joining of the metal member and a terminal (this step is referred to a pre-coat process and the metal used for the pre-coat process is referred to a pre-coat material), it is found that a wettability of the joint layer during joining is improved and the sealing property of the terminal after joining is also improved. As a method of performing the pre-coat process, it is possible to use a heat treatment at a temperature higher than a melting point of the pre-coat material, plating or sputtering. Especially, if the heat treatment is performed, the pre-coat material is penetrated not only on a surface of the terminal but also into a boundary of the ceramics member neighboring the embedded terminal, and thus it is possible to improve an oxidation resistance.

Particularly, in a joint structure such that: a metal electrode and a terminal made of molybdenum or molybdenum alloy are embedded in a ceramics member; an exposing portion of the terminal is exposed to a joint surface of the ceramics member; and the metal member is joined via a joint layer to the exposing portion of the terminal and a surface of the ceramics member; the terminal is corroded extraordinarily. The present invention can be used particularly preferably for such a joint structure mentioned above.

In the present invention, it is possible use a joint structure such that: a tubular atmosphere-shielding member is inserted into a hole arranged in a ceramics member; an electric power supply member and a low thermal expansion conductor for stress-mitigating are inserted inside the tubular atmosphere-shielding member; and the low thermal expansion conductor and the tubular atmosphere-shielding member are joined to an embedded member. In this case, the joint structure has excellent heat resistance and corrosive resistance properties as compared with the other joint structure, and it is possible to maintain a high joining strength and a good conductivity even if a heat cycle is applied thereto under an oxidative atmosphere or a corrosive atmosphere.

Hereinafter, the present invention will be explained with reference to the drawings.

FIG. 1 is a cross sectional view showing one embodiment of a joint structure according to the invention. An electrode 3 made of a metal net or a mesh is embedded in an almost discoidal ceramic substrate 2 having a semiconductor wafer-placing face 2a and a rear face 2b.

A hole 4 is formed in the substrate at a side of the rear face 2b. The netlike electrode 3 is embedded in the substrate 2, and a terminal 14 made of molybdenum or molybdenum alloy is also embedded therein. The terminal 14 comprises a main body 5, and a film 15 made of one or more metals selected from the group consisting of gold, platinum and palladium, which covers a part of a surface of the main body 5. The main body 5 of the terminal 14 may be formed by a bulky body made of molybdenum or molybdenum alloy or may be formed by a sintered body of respective powders of molybdenum or molybdenum alloy. One surface 5a of the terminal 14 is exposed to a bottom face 4a of the hole 4, while the other surface 5b of the terminal 14 contacts the metal electrode 3. A numeral 5c is a side face of the terminal 14.

In this embodiment, a tubular atmosphere-shielding member 9 is inserted into the hole 4. A slight gap 18 is arranged between an outer peripheral face 9a of the atmosphere-shielding member 9 and an inner peripheral face of the hole 4. A low thermal expansion conductor 7 having, for example, a discoidal shape is placed in a lower inner space of the atmosphere- shielding member 9.

A lower surface 7b of the low thermal expansion conductor 7 is gas-tightly joined to the bottom surface 4a of the hole 4 and to the terminal 14 by means of a joint layer 12 made of preferably a brazing material according to the invention.

Moreover, a lower surface 9d of the atmosphere-shielding body 9 is joined to the bottom surface 4a by means of the joint layer 12.

An electric power supply member 8 comprises a body member 8b outside a ceramics member 1, an annular flange portion 8c and a tip portion 8d, and the tip portion 8d is accommodated in the atmosphere-shielding member 9. A slight gap 19 is arranged between an inner peripheral surface 9b and the low thermal expansion conductor 7 and the tip portion 8d. A conductive joint layer 6B preferably made of a brazing material is formed between an upper surface 9c of the atmosphere-shielding member 9 and the flange portion 8c. In addition, a conductive joint layer 6A is formed between a tip surface 8a of the electric power supply member 8 and an upper surface 7a of the low thermal expansion conductor 7.

In the present invention, the low thermal expansion conductor 7 means a conductor made of a material having a thermal expansion coefficient of at least not more than $8.0 \times 10^{-6}/°$ C. at 400° C. or less. As a material for the low thermal expansion conductor, molybdenum, tungsten, molybdenum-tungsten alloy, tungsten-copper-nickel alloy and Kovar are used preferably. As a material for the atmosphere-shielding member, pure nickel, nickel based heat-resistive alloy, gold, platinum and their alloys are used preferably. As a material for the power supply member 8, a material having high corrosion resistance against the atmosphere is preferred. More specifically, pure nickel, nickel based heat-resistive alloy, gold, platinum, silver and their alloys are preferred.

Functions and effects of such a joint structure will be further explained with reference to mainly FIG. 1. As a material for the power supply member 8, a metal having oxidation resistance is preferably used. In general, such a metal has a large thermal expansion coefficient, and thus a large stress is generated due to a thermal expansion difference between the metal and the ceramics member. For this reason, if the power supply member 8 is directly brazed to the ceramics substrate 2, the joining strength tends to decrease due to a thermal expansion difference therebetween. In order to improve this arrangement, the low thermal expansion conductor 7 is placed between the power supply member 8 and the ceramics to reduce a heat stress difference therebetween.

However, a metal having a low thermal expansion coefficient such as molybdenum, tungsten and molybdenum-tungsten alloy is generally likely to be oxidized. Therefore, if the low thermal expansion conductor 8 is brought into contact with an oxidative atmosphere at a high temperature, the low thermal expansion conductor 7 is instantly oxidized, so that the joining strength drops and an electric resistance rises. Accordingly, it was difficult to use the metal having low thermal expansion coefficient as a material for the low thermal expansion conductor 7.

It is considered that if the low thermal expansion conductor 7 alternatively made of an insulating stress-mitigating material such as an insulation ceramics such as alumina, aluminum nitride and so on, there does not occur the problem that the low thermal expansion conductor 7 is oxidized. However, in this case, the stress-mitigating material is outside a current flow passage, and the stress-mitigating material cannot be electrically connected to the metal member arranged in the ceramics substrate. Therefore, an amount of electric power to be supplied to the metal member inside the substrate comes to be limited.

To the contrary, according to the joint structure of the present invention, an area of the connection between the low thermal expansion conductor 7 and the terminal main body 5 is large, and the low thermal expansion conductor 7 joins the current flow passage at this connection area. Consequently, a large current, for example, 30 amperes can be easily flowed.

In addition, the tubular atmosphere-shielding member 9 is placed and installed in the hole 4, while the low thermal expansion conductor 7 is positioned in the lower portion of the inner space of the atmosphere-shielding member 9, and the tip portion 8d of the power supply member 8 is inserted above the low thermal expansion conductor. Therefore, it is possible to completely surround and protect the peripheral surface side of the low thermal expansion conductor 7 by the atmosphere-shielding member 9. Further, it is possible to arrange the power supply member 8 on the low thermal expansion conductor and to surround the neighboring thereof by the atmosphere-shielding member 9.

Consequently, the length of the oxidative atmosphere-invading passage up to the low thermal expansion conductor 7 becomes very large. At the same time, the power supply member 8 is joined to the atmosphere-shielding member 9 by means of the conductive joint layer 6B, and this joined portion is gas-tightly kept. Thus, it is possible to completely ensure the isolation of the low thermal expansion conductor 7 from the oxidative atmosphere.

Furthermore, according to this embodiment, there are two current flow passages: one being a current flow passage passing through the tip portion 8d of the power supply member 8, the conductive joint layer 6B, the low thermal expansion conductor 7, the joint layer 12 and the terminal 14; and the other being a current flow passage passing through the flange portion 8c, the conductive joint layer 6B, the atmosphere-shielding member 9 and the joint layer 12. In this case, an amount of the electric power supplied to the electrode 3 can be more increased and stabilized.

Figure 2:
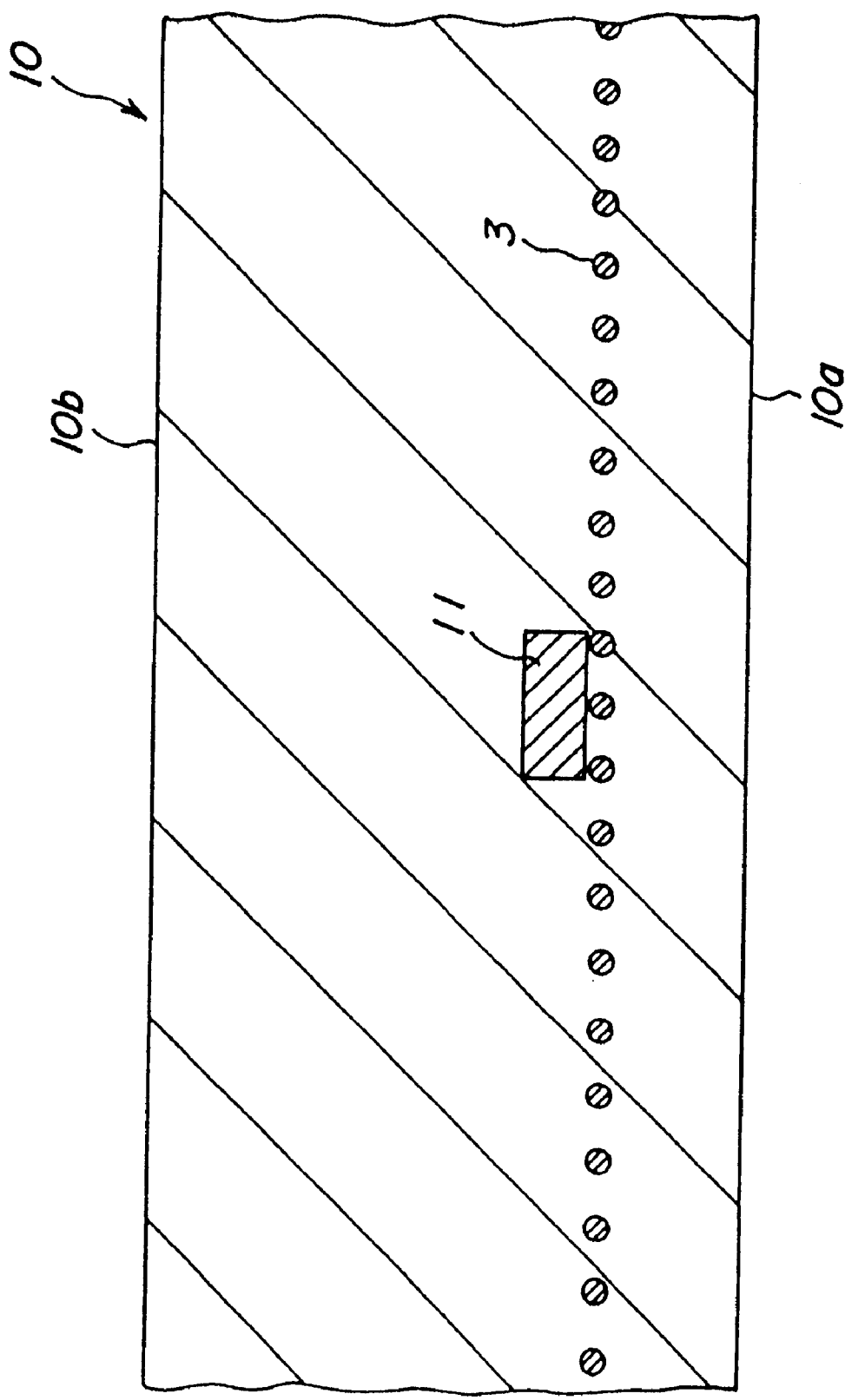
FIG. 2 is a cross sectional view illustrating a molded body 10 in which a metal electrode 3 and a molded body 11 made of powder sintered body are embedded.

In order to produce such a joint structure, a molded body 10 made of ceramics raw materials is prepared preferably as shown in FIG. 2, and is sintered. In this molded body 10, a netlike metal electrode 3 and a molded metal powder 11 for forming a sintered shaped powdery body are embedded. In FIG. 2, reference numerals 10a and 10b correspond to the semiconductor-placing face and the rear face thereof. When the molded body 10 is sintered, the molded powdery body 11 is simultaneously sintered to obtain the terminal main body 5.

Then, the hole 4 is formed in the sintered molded body 10 from the side of the rear face 2b by means of a grinding as shown in FIG. 3. In this case, a metal foil 13 made of gold, platinum or palladium is preferably placed on the surface 5a of the terminal main body 5, and is heated to obtain the terminal 14 as shown in FIG. 4 in an enlarged manner. In the terminal 14, the surface 5a of the terminal body 5 is covered with a film 15, and the film 15 is further inserted into a part of a slight gap between the side face 5c of the terminal 5 and the ceramics.

Then, as shown in FIG. 5, a material 16 for the joint layer, the low thermal expansion conductor 7, the tubular atmosphere-shielding member 9, materials 40A and 40B for the joint layer and the electric power supply member 8 are set in the hole 4, and are heated under a non-oxidative condition to obtain the joint structure shown in FIG. 1. The non-oxidative condition means a vacuum atmosphere or a non-oxidative atmosphere (preferably inert atmosphere).

The material 16 for the joint layer arranged between the bottom face 4a and the low thermal expansion conductor 7 as the metal member has preferably a structure such that an active metal material 43 made of one or more active metal selected from the group consisting of titanium, zirconium, hafnium, vanadium, niobium and magnesium and a brazing material 41 mainly made of one or more metal selected from the group consisting of gold, platinum and palladium are stacked in this order from the side of the bottom face 4a as shown in FIG. 6a. In this case, it is particularly preferred to form films 44A and 44B each made of one or more metal selected from the group consisting of gold, platinum and palladium on both surfaces of the active metal material 43. In order to produce such a film, sputtering, CVD, ion plating, depositing and plating may be used.

That is to say, since the active metal material 43 especially the active metal foil is liable to be oxidized during heating, it loses its activity during the joining operation. Therefore, if both surfaces of the active metal material especially the active metal foil are covered with the films 44A and 44B, it is possible to improve a yield and a joining strength much more.

In another embodiment, the material 16 for the joint layer arranged between the bottom face 4a and the metal member is preferably constructed by a brazing material 45 made of an alloy of one or more metal selected from the group consisting of gold, platinum and palladium and one or more active metal selected from the group consisting of titanium, zirconium, hafnium, vanadium, niobium and magnesium as shown in FIG. 6b.

Moreover, as shown in FIG. 7, overall of the surfaces 5a, 5b and the side face 5c of the terminal main body 5 may be covered with the film 15 made of one or more metal selected from the group consisting of titanium, zirconium and palladium to form a terminal 47. In this manner, it is possible to effectively prevent an oxidation of the terminal much more. In this case, prior to embedding the terminal 47 in the molded body, the film 15 is coated on the overall surfaces of the terminal body 5 by means of a method such as melting, sputtering, CVD, ion plating, plating and so on. After that, respective members are set as shown in FIG. 7 and are heated to obtain the joint structure as shown in FIG. 1.

Figure 8:
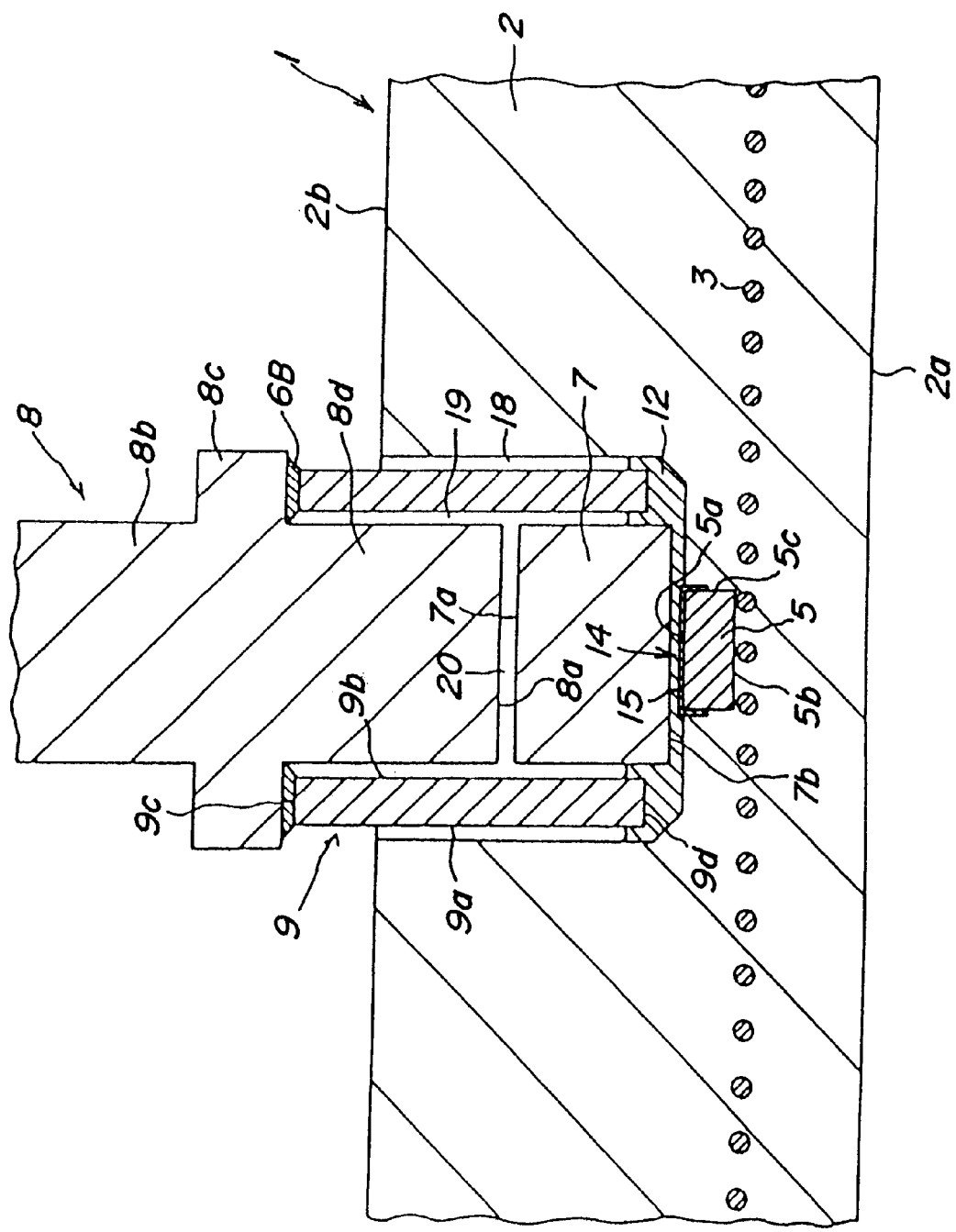
FIG. 8 is a cross sectional view depicting a joint structure in which a low thermal expansion conductor 7 and an electric power supply member 8 are not directly joined.

In the embodiment shown in FIG. 1, the low thermal expansion conductor 7 is electrically connected to the power supply member 8, but it is not essential to electrically connect them. FIG. 8 is a cross sectional view showing such a joint structure. In this embodiment shown in FIG. 8, the tip surface 8a of the electric power supply member 8 is not electrically connected to the low thermal expansion conductor 7 via the conductive joint layer, and a gap 20 is formed therebetween. However, in this case, since the low thermal expansion conductor 7 is directly and electrically connected to the terminal 14 via the joint layer 12 to form an electric passage and this electric passage has a low electric resistance, it is possible to supply a large current through this electric passage.

Figure 9:
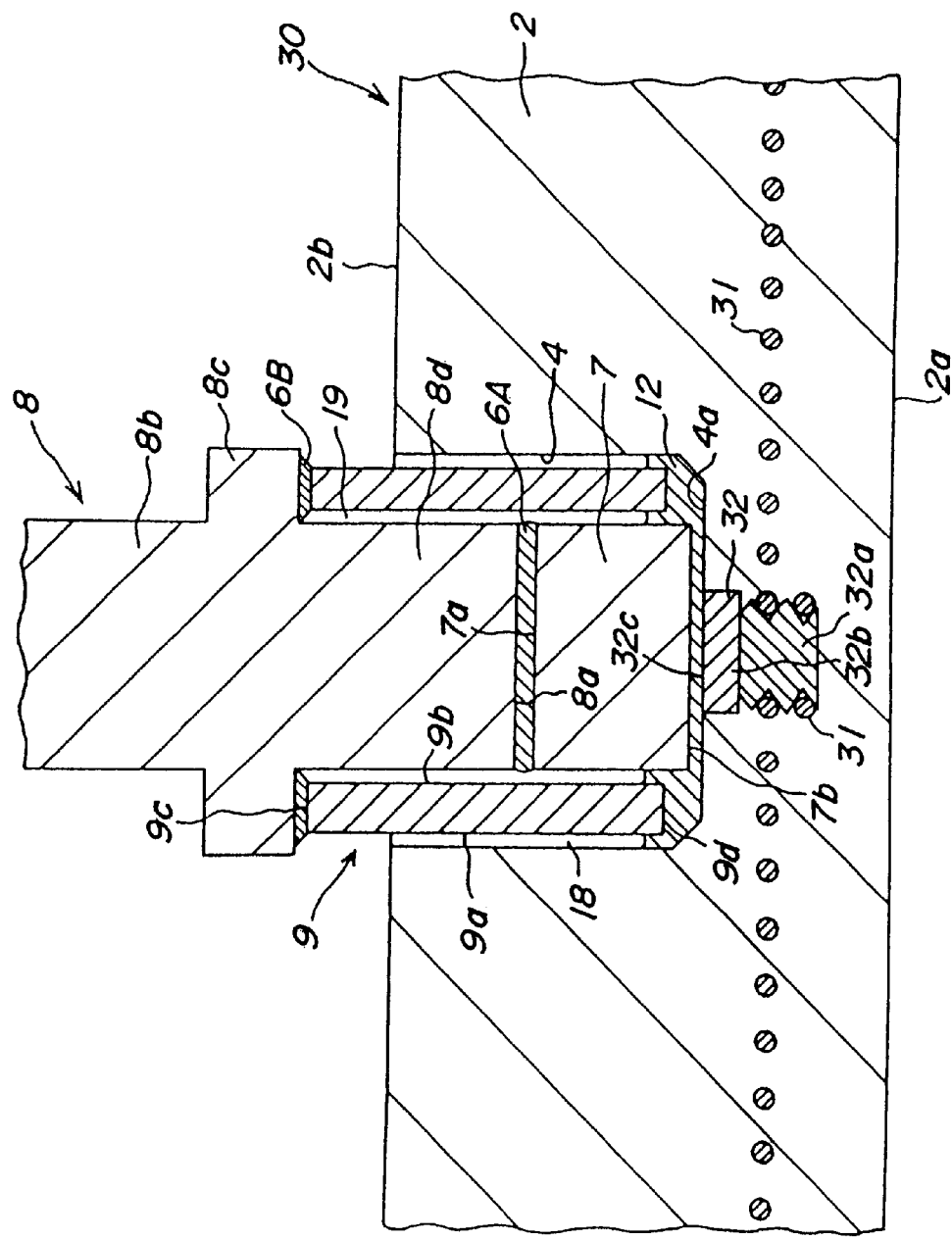
FIG. 9 is a cross sectional view showing a state in which a dense body 32 is embedded in the substrate 2.

FIG. 9 is a cross sectional view showing one embodiment in which a metal electrode and a dense body made of a low thermal expansion metal are embedded in a ceramics substrate. In this embodiment, for example, a metal electrode 31 having a coiled shape or the like is embedded in the substrate 2 of a ceramics heater 30. A coiled-shaped linear heater is a preferred embodiment of the metal electrode. A dense body 32 (one example of the embedded member) is embedded at a lower side of bottom face of the accommodating hole 4 of the substrate 2. The dense body 32 includes a male screw portion 32a and a main body 32b, and an upper face 32c of the main body 32b is electrically connected to the low thermal expansion conductor 7 via the joint layer 12. A coiled heater 31 is wound around the male screw portion 32a.

Figure 10:
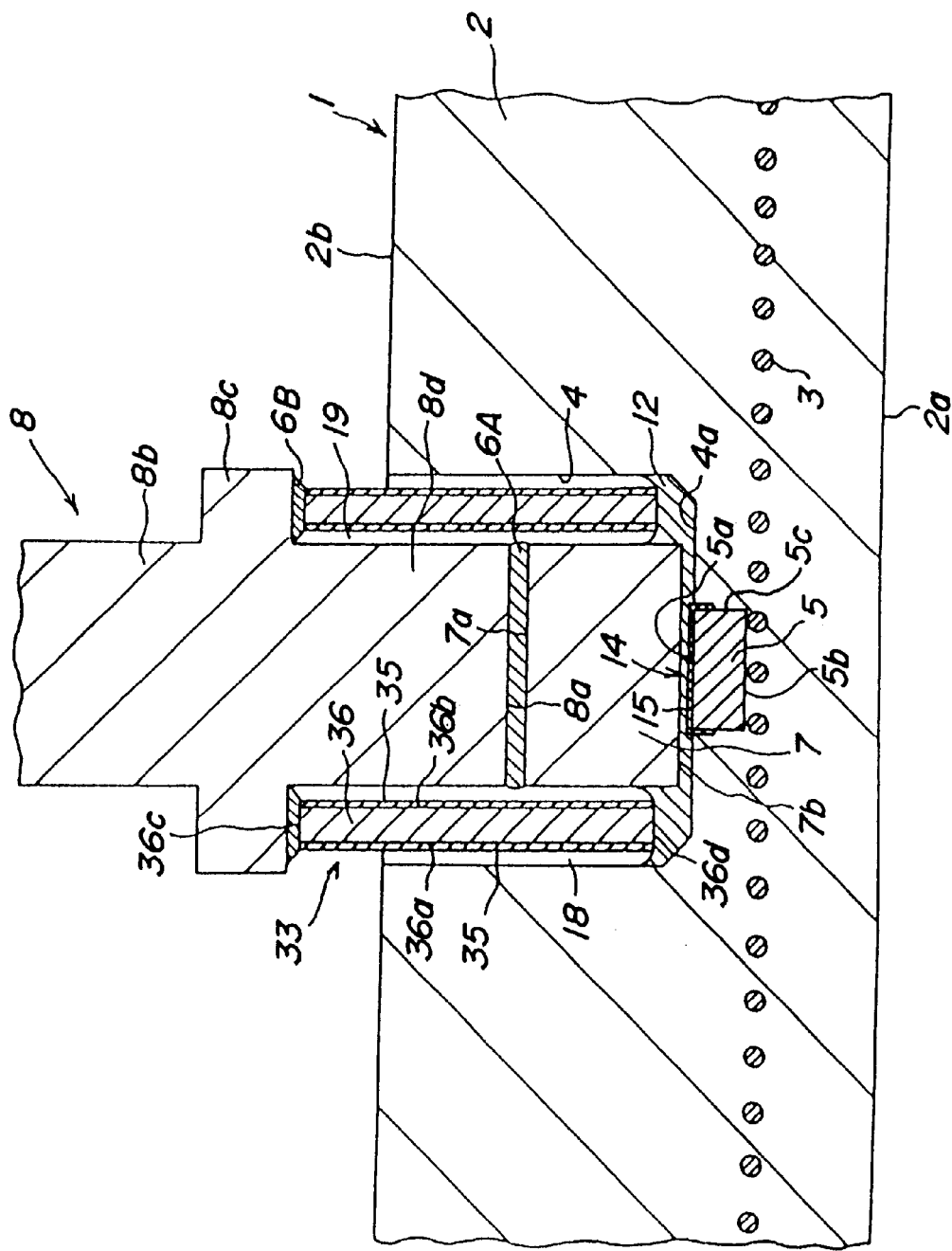
FIG. 10 is a cross sectional view illustrating a joint structure in which use is made of a tubular atmosphere-shielding member 33 having an oxidative film 35.
Figure 11:
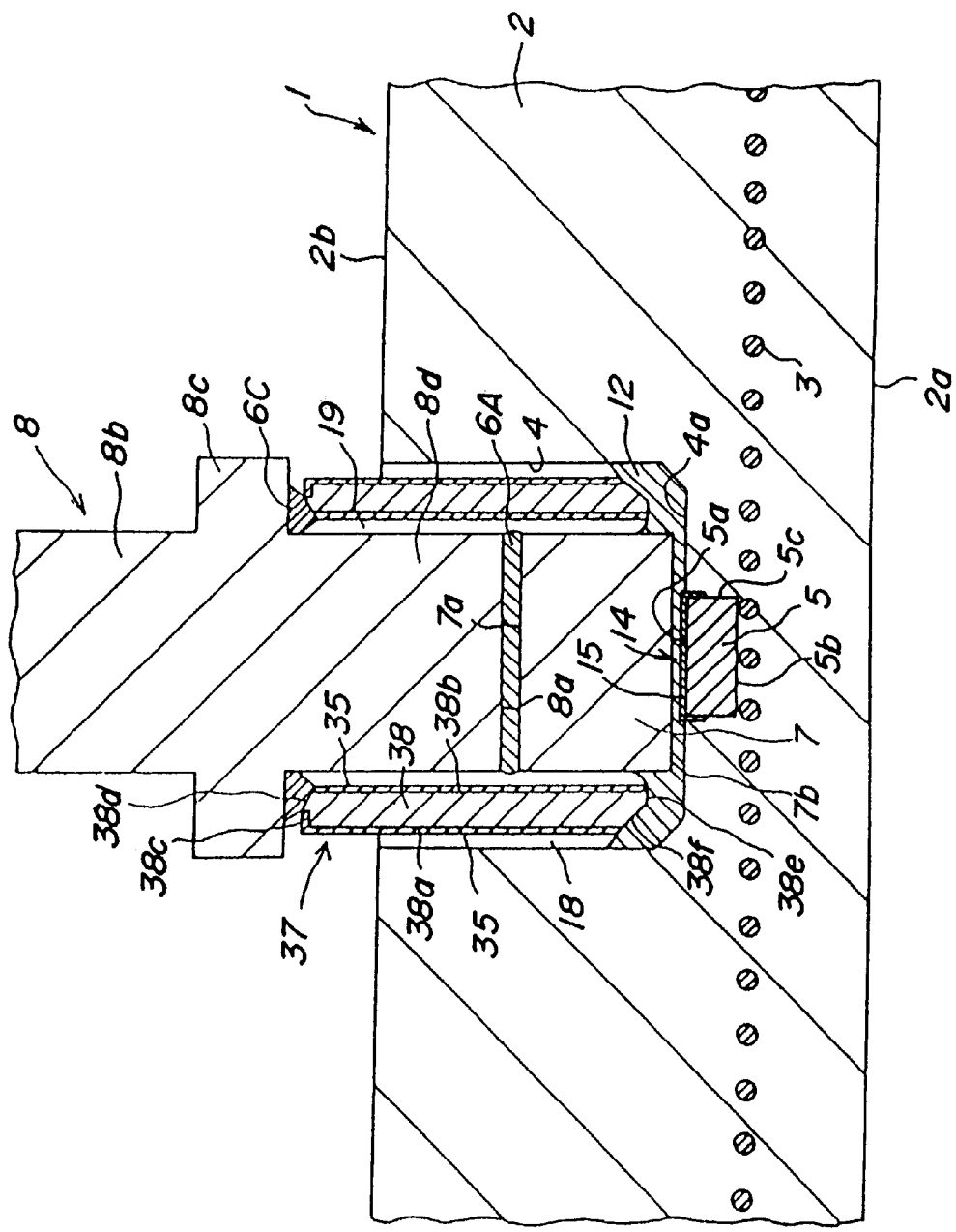
FIG. 11 is a cross sectional view depicting a joint structure in which use is made of an atmosphere-shielding member 37 having the oxidative film 35.
Figure 13:
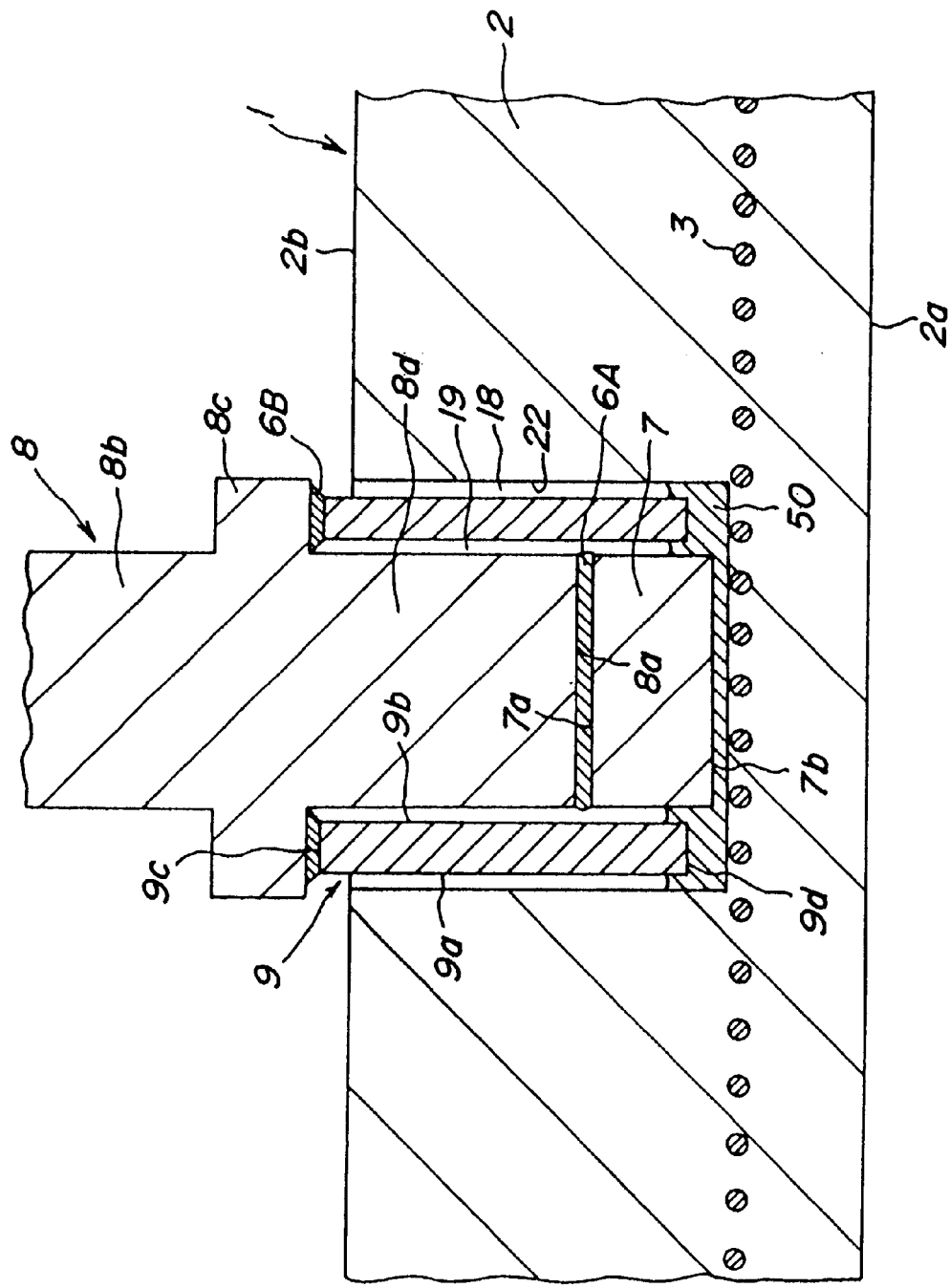
FIG. 13 is a cross sectional view illustrating a joint structure in which the low thermal expansion conductor 7 is directly joined to the substrate 2 and the electrode 3.

Joint structures in embodiments shown in FIGS. 10 and 11 are similar to that in FIG. 1 except that the structure of the atmosphere-shielding member differs between them. In the joint structure of FIG. 10, an atmosphere-shielding member 33 includes a main body 36 made of a heat-resistive metal as mentioned above and an oxide film 35 covering outer and inner surfaces 36c and 36d of the main body 36. The metal constituting the main body 36 is exposed at upper and lower surfaces 36c and 36d of the main body 36.

The exposed upper surface 36c of the main body 36 is joined to the electric power supply member 8 via the conductive joint layer 6B. Moreover, the lower face 36d of the main body 36 is joined to the terminal 14 via the conductive joint layer 12.

Since the oxide film 35 exhibits lower wettability for the brazing material as compared with the corrosion-resistive metal constituting the main body 36, the brazing material is less likely to rise along the inner and outer peripheral surfaces of the atmosphere-shielding member 33, so that the brazing material tends to rise along the peripheral surface of the accommodating hole 4. Owing to this, the shape of the conductive joint layer 12 in the accommodating hole 4 can be of a fillet shape causing less residual stress. Further, reliability in strength can be enhanced by employing a screwing engagement structure between the atmosphere-shielding member 33 and the accommodating hole 4.

In a joint structure of FIG. 11, an atmosphere-shielding member 37 includes a main body 38 made of a heat-resistant metal and the oxide film 35 as mentioned above. Outer and inner peripheral surfaces 38a and 38b and an upper flat surface 38c of the main body 38 are covered with the oxide film 35. The metal constituting the main body 38 is exposed at an upper inclined surface 38d, a lower flat surface 38e and a lower inclined surface 38f of the main body 38.

The exposed upper inclined surface 38d of the main body 38 is joined to the electric power supply member 8 via a conductive joint layer 6C. Moreover, the lower inclined surface 38f and the lower flat surface 38e are joined to the substrate 2 via the joint layer 12.

In order to produce the atmosphere-shielding members in the embodiments of FIGS. 10 and 11, the following method which will be explained with reference to FIGS. 12a to 12c is preferred. First, as shown in FIG. 12a, a tubular member 40 made of the above heat-resistant metal is prepared, and the oxide film 35 is formed over the entire surface of the tubular member 40 by heating the tubular member 40 in an oxidative atmosphere. Next, the exposed surfaces 36c and 36d shown in FIG. 12b are formed by grinding opposite end surfaces of the main body 40. Exposed surfaces 38d, 38e and 38f shown in FIG. 12c can be formed by grinding the tubular member of FIG. 12a. In this case, the oxide film 35 remains on the upper flat surface 38c, the outer peripheral surface 38a and the inner peripheral surface 38b of the main body 38.

In an embodiment of FIG. 12, no terminal 14 is used. That is, a hole 22 opening at a side of the rear face 2b of the substrate 2 is formed, and a part of the netlike electrode 3 (one example of the embedded member) is exposed to this hole 22. The netlike electrode 3 is joined to both the low thermal expansion conductor 7 and the lower surface 9d of the atmosphere-shielding member 9 with a joint layer 50 according to the invention.

However, as shown in FIG. 1, it is preferred to interpose the terminal 14 between the metal electrode 3 inside the ceramics substrate and the low thermal expansion conductor 7, because the length of the transmitting path for the oxidizing gas or the corrosive gas to reach the metal electrode is greater.

In the embodiments as shown in FIGS. 1, 8, 9, 10, 11 and 13, the gap 18 between the inner peripheral surface of the holes 4, 22 and the outer peripheral surface 9a of the atmosphere-shielding member 9 is preferably not less than 0.2 mm. The gap 19 between the inner peripheral surface 9b of the atmosphere-shielding member 9 and the low thermal expansion conductor 7 and the tip portion 8d is preferably not less than 0.01 mm. If the gap 18 is less than 0.2 mm and/or the gap 19 is less than 0.01 mm, the brazing material is likely to rise in the gap due to the capillary action. If the brazing material rises in such a gap, a crack is liable to be generated in the ceramics substrate and the brazing material. The reason why the lower limit of the gap 18 is 0.2 mm and that of the gap 19 is 0.01 mm is 0.01 mm is that if this gap is sealed, this gap gives resistance against the capillary force because the gap is closed at both the joint layers 12 and 6B. It is more preferable that both the gaps 18 and 19 are not more than 1.0 mm.

The present invention will be explained in more detail with reference to the following specific example and comparative example.

EXAMPLE A ACCORDING TO THE PRESENT INVENTION

A joint structure shown in FIG. 1 was produced according to the method explained with reference to FIGS. 1 to 6. First, the molded body 10 shown in FIG. 2 was prepared by uniaxially press molding aluminum nitride powders.

As the metal electrode 3, a metal net made of molybdenum was used, which had 0.12 mm-diameter molybdenum wires knitted at a density of 50 wires per inch. The metal net was embedded in the preliminarily molded body 10. In addition, the molded body 11 was prepared by molding molybdenum powders having a particle size of 1–100 μm. The molded body 11 was also embedded in the molded body 10.

This molded body 10 was placed in a mold in the state that the molded body 10 was sealed in a carbon foil, and sintered at a temperature of 1950° C. under pressure of 200 kg/cm$^2$ for a retaining time of 2 hours by hot press, thereby obtaining a sintered body having a relative density of not less than 98.0%.

As shown in FIG. 3, a hole 4 was formed in the thus obtained sintered body from a rear face side by a machining center, thereby producing a specimen of the ceramics member. The specimen had a rectangular shape having a dimension of 20 mm×20 mm×20 mm.

On the other hand, the atmosphere-shielding member 33 was prepared as shown in FIGS. 12a and 12b. More specifically, the tubular member 40 made of nickel was prepared, and the thus prepared tubular member 40 was thermally treated at 1000° C. in air for 2 hours, thereby forming the nickel oxide film 35 on it. The resulting tubular member was ground to obtain the atmosphere-shielding member 33 shown in FIG. 12b.

The main body 5 made of the sintered body of molybdenum powders was ground to remove oxides and carbides remained thereon, and was washed and dried up. In a specimen No. A5 of Table 1, the gold plate 13 having a weight of 5±0.5 mg was placed on the surface 5a of the main body 5 as shown in FIG. 3, and was heated at a temperature of 1080° C. for 1 hour to form the film 15. Then, it was confirmed that the overall surface of the terminal main body 5 had a gold color by naked eyes. In the specimens other than A5, no metallizing mentioned above was effected to the terminal made of molybdenum.

The brazing material 41 and the active metal foil 43 shown in FIG. 6 were accommodated in the hole 4, and were joined by heating them to obtain joint structures according to specimens Nos. A1–A14. Materials used for the brazing material 41 and the active metal foil 43 were also indicated in Table 1. In this case, in the specimen Nos. A4 and A5, gold sputtering films 44A and 44B having a thickness of 400

Furthermore, an appearance of the aluminum nitride substrate 2 was observed by naked eyes at before and after heat cycles, and the results were shown in Table 1. Moreover, whether a leaching of compound having low melting point was existent on a surface of the substrate 2 was also confirmed.

TABLE 1

| No. | Brazing material (wt %) | Active metal foil | Metallizing to Mo terminal | Tensile strength (kgf) After joining | Tensile strength (kgf) After heat cycle | Insulation resistance (GΩ) After joining | Insulation resistance (GΩ) After heat cycle | AIN surface after heat cycle Appearance | AIN surface after heat cycle Existence of MO |
|---|---|---|---|---|---|---|---|---|---|
| A1 | Au | Ti foil | no-effect | 70 | 40 | >100 | >100 | no change | no-existence |
| A2 | Au—8Ni | Ti foil | no-effect | 80 | 50 | >100 | >100 | no change | no-existence |
| A3 | Au—26Ni | Ti foil | no-effect | 80 | 50 | >100 | >100 | no change | no-existence |
| A4 | Au—18Ni | Au sputtering on both surfaces of Ti foil | no-effect | 80 | 55 | >100 | >100 | no change | no-existence |
| A5 | Au—18Ni | Au sputtering on both surfaces of Ti foil | effect (Au) | 85 | 65 | >100 | >100 | no change | no-existence |
| A6 | Au—20Cu | Ti foil | no-effect | 70 | 45 | >100 | >100 | no change | no-existence |
| A7 | Pd—40Ni | Ti foil | no-effect | 65 | 35 | >100 | >100 | no change | no-existence |
| A8 | Pt—2B | Ti foil | no-effect | 65 | 30 | >100 | >100 | no change | no-existence |
| A9 | Au | Zr foil | no-effect | 65 | 30 | >100 | >100 | no change | no-existence |
| A10 | Au—18Ni | Zr foil | no-effect | 70 | 35 | >100 | >100 | no change | no-existence |
| A11 | Au | V foil | no-effect | 70 | 35 | >100 | >100 | no change | no-existence |
| A12 | Au—18Ni | V foil | no-effect | 70 | 35 | >100 | >100 | no change | no-existence |
| A13 | Au | Nb foil | no-effect | 70 | 40 | >100 | >100 | no change | no-existence |
| A14 | Au—18Ni | Nb foil | no-effect | 75 | 45 | >100 | >100 | no change | no-existence |
| A15 | Au—2Ti | none | no-effect | 70 | 40 | >100 | >100 | no change | no-existence |
| A16 | Au—16Ni—2Ti | none | no-effect | 80 | 50 | >100 | >100 | no change | no-existence |
| A17 | Pd—40Ni—2Ti | none | no-effect | 65 | 30 | >100 | >100 | no change | no-existence |
| A18 | Pt—2B—2Ti | none | no effect | 65 | 30 | >100 | >100 | no change | no-existence | angstrom were formed on both surfaces of the titanium foil 43, on which the low thermal expansion conductor 7 made of molybdenum and the atmosphere-shielding member 33 were placed.

Moreover, the brazing material 41 made of Au-18 wt % Ni and the titanium foil 43 were placed on the low thermal expansion conductor 7, and the tip portion 8d of the electric power supply member 8 made of nickel was further placed thereon. In addition, the brazing material 41 made of Au-18 wt % Ni and the titanium foil 43 were also placed between the upper surface 36c of the atmosphere-shielding member 33 and the flange portion 8c. The resulting assembly was subjected to a heat treatment at a temperature of 960° C.–1000° C. for 10 minutes to obtain the joint structure shown in FIG. 1.

Further, in the specimens Nos. A15–A18, the brazing materials indicated in Table 1 were used, but no active metal foils were used.

With respect to the thus obtained joint structures, a tensile strength after joining and an insulation resistance after joining were measured. The results were shown in Table 1.

Moreover, with respect to the joint structures, a heat cycle between 100° C. and 700° C. was applied for 50 cycles. In this case, a temperature ascending rate and a temperature descending rate were both about 20° C./minute. After that, a tensile strength was measured, and the measured tensile strength was indicated in Table 1as a tensile strength after heat cycle. Further, an insulation resistance was measured, and the measured insulation resistance was indicated in Table 1 as an insulation resistance after heat cycle.

As can be seen from Table 1, according to the joint structure of the present invention, it was understood that: a joining strength after heat cycle was large; an insulation resistance was large as not less than 100 GΩ; an appearance was not changed after heat cycle; and a leaching of the low melting point compound was not detected. Particularly, it was understood that a tensile strength after heat cycle was larger in the specimen Nos. A4 and A5 in which gold was metallized on both surfaces of the active metal foil.

COMPARATIVE EXAMPLE B

As is the same as the Example A, joint structures of specimens Nos. B1–B3 in Table 2 were produced according to the method explained with reference to FIGS. 1 to 6. However, in the specimen Nos. B1 and B2, the brazing material 41 shown in FIG. 6a was made of silver or silver-copper alloy. In the specimen No. B3, the brazing material 45 shown in FIG. 6b was made of copper-aluminum-silicon-copper alloy. Further, a generation of the sputtering film on the active metal foil and a metallizing to the terminal made of molybdenum were not effected. The measuring results were shown in Table 2.

TABLE 2

| Brazing material No. | (wt %) | Active metal foil | Metallizing to Mo terminal | Tensile strength (kgf) After joining | After heat cycle | Insulation resistance (GΩ) After joining | After heat cycle | AlN surface after heat cycle Appearance | Existence of MO |
|---|---|---|---|---|---|---|---|---|---|
| B1 | Ag | Ti foil | no-effect | 100 | 20 | >100 | 0.01 | dark brown stain | existence |
| B2 | Ag—28Cu | Ti foil | no-effect | 90 | 15 | >100 | 0.01 | dark brown stain | existence |
| B3 | Cu—2Al—3Si—Ti | none | no-effect | 90 | 15 | >100 | >100 | no change | existence |

As can be seen from the above results, it was understood, from the specimen Nos. B1 and B2 in which silver brazing material or silver-copper brazing material was used, that: a tensile strength and an insulation resistance were extraordinarily decreased after heat cycle; a dark brown stain was detected on the substrate; and a leaching of low melting point compound was observed. Moreover, it was understood, from the specimen No. B3 in which copper-aluminum-silicon-titanium alloy, that: an appearance was not changed after heat cycle; an insulation resistance was not decreased after heat cycle; but a tensile strength was decreased after heat cycle.

EXAMPLE C ACCORDING TO THE PRESENT INVENTION

As is the same as the Example A, joint structures of specimens Nos. C1–C6 in Table 3 were produced. However, a shape of the specimen was not m rectangular, but a discoidal aluminum nitride substrate having a diameter of 200 mm and a thickness of 20 mm was used as the specimen. Moreover, in the specimen Nos. C1–C4, a titanium foil was used as the active metal foil, and the brazing material 41 shown in FIG. 6a was changed as shown in Table 3. In the specimen No. C3, gold sputtering films 44A and 44B having a thickness of 400 angstrom were formed on both surfaces of the titanium foil 43. In the specimen Nos. B5 and B6, the brazing material 45 shown in FIG. 6b was changed as shown in Table 3.

Moreover, in respective specimens, the gold plate 13 having a weight of 5±0.5 mg was placed on the surface 5a of the main body 5 as shown in FIG. 3, and was heated at a temperature of 1080° C. for 1 hour to form the film 15. Further, it was confirmed by naked eyes that overall surface of the terminal main body 5 became a gold color.

With respect to the thus obtained joint structures, a heat cycle between room temperature and 650° C. was applied. In this case, a temperature ascending rate and a temperature descending rate were both about 20° C./minute. Then, whether an operation life was exhausted after heat cycle of 100 cycles was confirmed. Moreover, an operation life when the joint structure was maintained at a temperature of 750° C. was measured. In this case, the operation life was defined as a time duration from an operation start to an operation stop when a thermocouple for a temperature control was broken due to a large leak current on the ceramics substrate or when the embedded terminal was oxidized and caused a conduction defect.

TABLE 3

| | | | Operation life | |
|---|---|---|---|---|
| No. | Brazing material (wt %) | Active metal foil | Heat cycle RT <>650° C. | Maintaining at high temperature 750° C. |
| C1 | Au | Ti foil | >100 cycles | 18 days |
| C2 | Au-18Ni | Ti foil | >100 cycles | >20 days |
| C3 | Au-18Ni | Au sputtering on both surfaces of Ti foil | >100 cycles | >20 days |
| C4 | Au-20Cu | Ti foil | >100 cycles | 15 days |
| C5 | Au-2Ti | none | >100 cycles | 15 days |
| C6 | Au-16Ni-2Ti | none | >100 cycles | >20 days |

From the above results, it was understood that all the joint structures endured for heat cycle of 100 cycles. Moreover, it was understood that all the joint structures had an operation life of 15 days or more when they were maintained at 750° C. Further, it was understood that an operation life when they were maintained at 750° C. was longer if the brazing material made of gold-nickel alloy was used.

COMPARATIVE EXAMPLE D

As is the same as the Example C, joint structures according to specimen Nos. D1–D3 shown in Table 4 were produced, and the same examinations as those of the Example C were performed with respect to the joint structures. The measuring results were shown in Table 4.

TABLE 4

| No. | Brazing material (wt %) | Active metal foil | Heat cycle RT <>650° C. | Maintaining at high temperature 750° C. |
|---|---|---|---|---|
| D1 | Ag | Ti foil | 50 cycles | 5 days |
| D2 | Ag-28Cu | Ti foil | 45 cycles | 5 days |
| D3 | Cu-2Al-3Si-2Ti | none | 48 cycles | 4 days |

From the above results, it was understood that an operation was stopped by heat cycle of 50 cycles or less. Moreover, it was understood that an operation life was 5 days or less when they were maintained at 750° C.

EXAMPLE E ACCORDING TO THE PRESENT INVENTION

As is the same as the Example A, joint structures according to specimen Nos. E1–E5 shown in Table 5 were produced. However, in the specimen Nos. E1, E2 and E4, the brazing material 41 shown in FIG. 6a and the active metal foil 43 were changed as shown in Table 5. In the specimen Nos. E2 and E4, gold sputtering films 44A and 44B having a thickness of 400 angstrom were formed on both surfaces of the titanium foil 43. In the specimen No. E3, the brazing material was made of gold-nickel-titanium alloy. In the specimen No. E4, the gold plate 13 was placed on the surface 5a of the main body 5, and was heated at 1080° C. for 1 hour to form the film 15. With respect to the specimens, a yield percent during brazing for respective 10 specimens was measured, and the measuring results were shown in Table 5.

TABLE 5

| No. | Brazing material (wt %) | Active metal foil | Metallizing to Mo terminal | Yield (%) n = 10 |
|---|---|---|---|---|
| E1 | Au-18Ni | Ti foil | no-effect | 60 |
| E2 | Au-18Ni | Au sputtering on both surfaces of Ti foil | no-effect | 100 |
| E3 | Au-16Ni-2Ti | none | no-effect | 90 |
| E4 | Au-18Ni | Au sputtering on both surfaces of Ti foil | effect (Au) | 100 |

From the above results, it was understood that a yield percent during brazing was extraordinarily improved if the gold sputtering films were formed on both surfaces of the titanium foils.

As clearly understood from the above explanations, according to the invention, it is possible to prevent an insulation defect due to a corrosion of the embedded member or a leaching of low melting point compound on a surface of the ceramics member, in the joint structure in which the embedded member made of metal including molybdenum is embedded in the ceramics member, and the embedded member in the ceramics member is joined to the metal member.

What is claimed is:

1. A ceramics joint structure in which a ceramics member having an oxidation resistance property and a metal member are joined via a joint layer, comprising a structure such that:

(1) an embedded member made of a metal including at least molybdenum is embedded in said ceramics member;

(2) a part of said embedded member is exposed to a joint surface of said ceramics member to form a metal exposing portion which is contacted with said joint layer;

(3) said ceramics member and said metal exposing portion are joined via said joint layer to said metal member respectively; and (4) said joint layer comprises more than 50% by weight with respect to all the metal in the joint layer of at least one metal selected from the group consisting of gold, and palladium.

2. The ceramics joint structure according to claim 1, wherein said joint layer further includes one or more active metal selected from the group consisting of titanium, zirconium, hafnium, vanadium, niobium and magnesium.

3. The ceramics joint structure according to claim 1, wherein: a terminal made of molybdenum or molybdenum alloy is embedded in said ceramics member as said embedded member.

4. The ceramics joint structure according to claim 1, wherein: a hole is arranged in said ceramics member; a tubular atmosphere-shielding member is inserted into said hole; an electric, power supply member and a low thermal expansion conductor for mitigating stress are inserted inside said tubular atmosphere-shielding member; said tubular atmosphere-shielding member and said electric power supply member are joined with each other; and said low thermal expansion conductor and said tubular atmosphere-shielding member are joined to said metal exposing portion of said embedded member.

5. The ceramics joint structure according to claim 4, wherein: said embedded member is a terminal made of molybdenum or molybdenum alloy; said terminal is electrically joined to said low thermal expansion conductor; a metal electrode is embedded in said ceramics member; and said terminal is electrically joined to said metal electrode.

6. The ceramics joint structure according to claim 1, wherein said joint layer comprises more than 50 wt % of gold.

* * * * *

UNITED STATES PATENT AND TRADEMARK OFFICE
CERTIFICATE OF CORRECTION

PATENT NO.    : 6,617,514 B1
DATED         : September 9, 2003
INVENTOR(S)   : Ryusuke Ushikoshi et al.

It is certified that error appears in the above-identified patent and that said Letters Patent is hereby corrected as shown below:

<u>Column 16,</u>
Line 10, after "gold," insert -- platinum, --.

Signed and Sealed this

Twenty-eighth Day of October, 2003

JAMES E. ROGAN
*Director of the United States Patent and Trademark Office*